United States Patent
Baek et al.

(10) Patent No.: US 7,605,875 B2
(45) Date of Patent: Oct. 20, 2009

(54) THIN FILM TRANSISTOR ARRAY PANEL FOR A LIQUID CRYSTAL DISPLAY AND A METHOD FOR MANUFACTURING THE SAME

(75) Inventors: Bum-Kee Baek, Kyungki-do (KR); Hyang-Shik Kong, Kyungki-do (KR); Dal-Moe Kim, Kyungki-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/450,898

(22) Filed: Jun. 8, 2006

(65) Prior Publication Data

US 2006/0285027 A1    Dec. 21, 2006

Related U.S. Application Data

(60) Continuation of application No. 10/885,004, filed on Jul. 7, 2004, now Pat. No. 7,139,045, which is a continuation of application No. 10/280,049, filed on Oct. 25, 2002, now Pat. No. 6,768,521, which is a division of application No. 09/421,478, filed on Oct. 20, 1999, now Pat. No. 6,493,048.

(30) Foreign Application Priority Data

Oct. 21, 1998  (KR) ............................... 1998-44121
Dec. 21, 1998  (KR) ............................... 1998-56725

(51) Int. Cl.
    G02F 1/1343    (2006.01)
    G02F 1/136    (2006.01)
(52) U.S. Cl. ......................................... 349/38; 349/43
(58) Field of Classification Search .................. 349/43, 349/38
    See application file for complete search history.

(56) References Cited

U.S. PATENT DOCUMENTS 5,923,390 A * 7/1999 Jung Mok et al. ............. 349/38

(Continued)

FOREIGN PATENT DOCUMENTS

| JP | 3-17809 | 11/1994 |
| JP | 08-160457 | 6/1996 |
| JP | 09-189924 | 7/1997 |
| JP | 11-133455 | 5/1999 |
| KR | 10-1997-53623 | 7/1997 |
| KR | 10-0139346 | 3/1998 |

*Primary Examiner*—James A Dudek
(74) *Attorney, Agent, or Firm*—Innovation Counsel LLP

(57) ABSTRACT

Disclosed is a simplified manufacturing method for liquid crystal displays. A gate wire including a gate line, a gate pad and a gate electrode is formed on an insulating substrate. Next, a gate insulating layer covering the gate wire, a semiconductor layer, an ohmic contact layer, and a data conductive layer are sequentially deposited, and a photoresist pattern is formed on the data conductive layer. Following this step, the data conductive layer, using the photoresist pattern as an etch mask, is etched to form a data wire including a data line, a source electrode, a drain electrode, and a data pad. Next, the photoresist pattern is reflowed to cover the portion between the source electrode and the drain electrode, and a portion of the ohmic contact layer adjacent to a periphery of the data wire. Subsequently, portions of the ohmic contact layer and the semiconductor layer, which are not covered by the photoresist pattern, are etched, and the photoresist pattern is removed. Next, a portion of the ohmic contact layer, which is not covered by the data wire, is etched to expose a portion of the semiconductor layer between the source electrode and the drain electrode that is a channel portion of a thin film transistor. Finally, a protection layer, a pixel electrode, a redundant gate pad and a redundant data pad are formed.

14 Claims, 20 Drawing Sheets

U.S. PATENT DOCUMENTS

| | | |
|---|---|---|
| 5,926,235 A * | 7/1999 | Han et al. .................... 349/43 |
| 6,016,174 A * | 1/2000 | Endo et al. ................... 349/43 |
| 6,057,896 A * | 5/2000 | Rho et al. .................... 349/42 |
| 6,091,466 A | 7/2000 | Kim et al. |
| 6,115,088 A * | 9/2000 | Zhang et al. ................. 349/39 |
| 6,380,011 B1 | 4/2002 | Yamazaki et al. |
| 6,614,500 B2 | 9/2003 | Kim |
| 6,787,809 B2 | 9/2004 | Hong et al. |

\* cited by examiner

THIN FILM TRANSISTOR ARRAY PANEL FOR A LIQUID CRYSTAL DISPLAY AND A METHOD FOR MANUFACTURING THE SAME

CROSS-REFERENCE TO RELATED APPLICATIONS

This application is a continuation of, and claims priority from, U.S. application Ser. No. 10/885,004, filed on Jul. 7, 2004, now U.S. Pat. No. 7,139,045 entitled "Thin Film Transistor Array Panel for a Liquid Crystal Display and a Method for Manufacturing the Same," which is a continuation of and claims priority from U.S. application Ser. No. 10/280,049 filed Oct. 25, 2002 (now issued as U.S. Pat. No. 6,768,521), which is a divisional of and claims priority from U.S. application Ser. No. 09/421,478 filed Oct. 20, 1999 (now issued as U.S. Pat. No. 6,493,048), which claims priority of Korean patent application no. 1998-56725 filed Dec. 21, 1998 and Korean patent application no. 1998-44121, filed Oct. 21, 1998, all of which are incorporated by reference herein in their entireties.

BACKGROUND OF THE INVENTION (a) Field of the Invention

The present invention relates to thin film transistor (TFT) array panels for a liquid crystal display (LCD) and a method for manufacturing the same using four photolithography steps.

(b) Description of the Related Art

An LCD is one of the most widely used FPDs (flat panel displays). The LCD includes two panels having electrodes for generating electric fields and a liquid crystal layer interposed between the two panels. The transmittance of incident light is controlled by the intensity of the electric field applied to the liquid crystal layer.

The field-generating electrodes are typically provided at both or one of the panels, and one of the panels includes switching elements such as thin film transistors.

In general, a thin film transistor array panel is manufactured by a photolithography process using a plurality of photomasks. Conventionally, five or six photolithography steps are employed. Since the photolithography process is expensive, it is desirable to reduce the number of photolithography steps. Even though manufacturing methods using only four photolithography steps have been suggested, these proposed methods are not easy to implement.

SUMMARY OF THE INVENTION

It is therefore an object of the present invention to provide a new manufacturing method for a thin film transistor array panel for a liquid crystal display using four photolithography steps.

It is another object of the present invention to prevent the current leakage in a liquid crystal display. Another object of the present invention is to reduce the step coverage of thin film transistor array panels for liquid crystal displays.

In order to achieve these and other objects, according to the present invention, a semiconductor layer and a protection layer of organic insulating material are patterned in a single step. Also, according to the present invention, a photoresist (PR) pattern is reflowed to form an upper layer. Thus, the reflowed PR pattern is used to form a lower layer under the upper layer such that the lower layer is extended outside the upper layer.

DETAILED DESCRIPTION OF THE PREFERRED EMBODIMENTS

Figure 1:
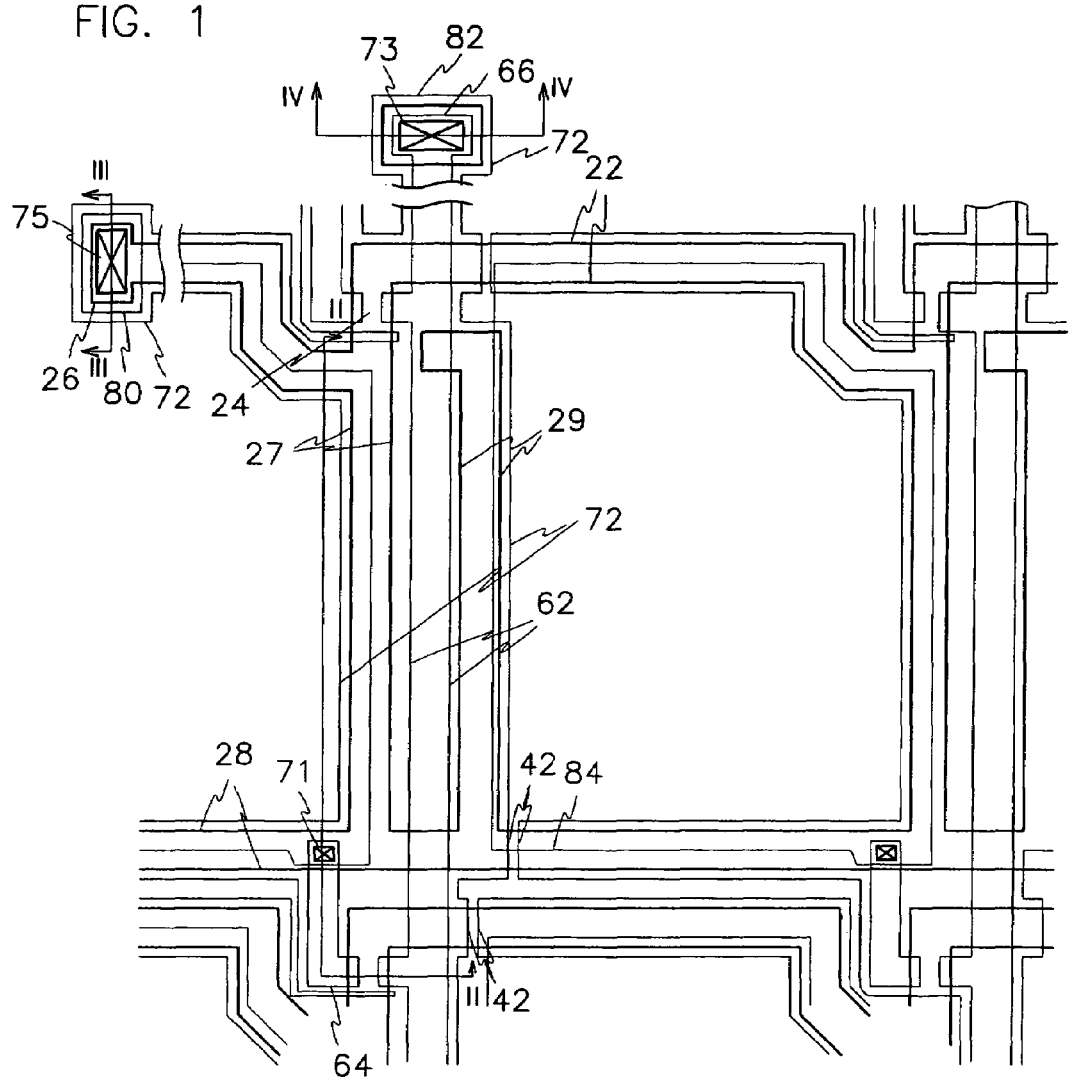
FIG. 1 is a layout view of a thin film transistor array panel for a liquid crystal display according to a first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

The number of steps in a manufacturing method according to the present invention can be reduced by patterning a semiconductor layer and a protection layer of organic insulating material in a single step.

First, the structure of a thin film transistor array panel for a liquid crystal display produced through a method according to the first embodiment of the present invention will be described with reference to FIGS. 1 to 4.

Figure 2:
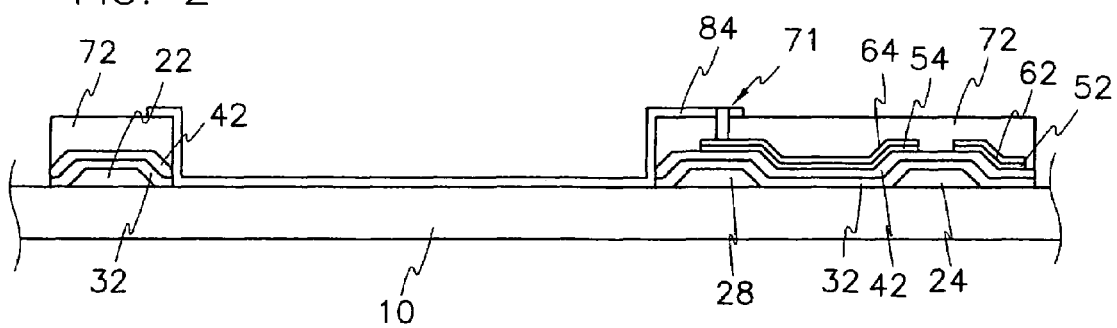
FIG. 2 is a cross-sectional view taken along line II-II of FIG. 1.
Figure 3:
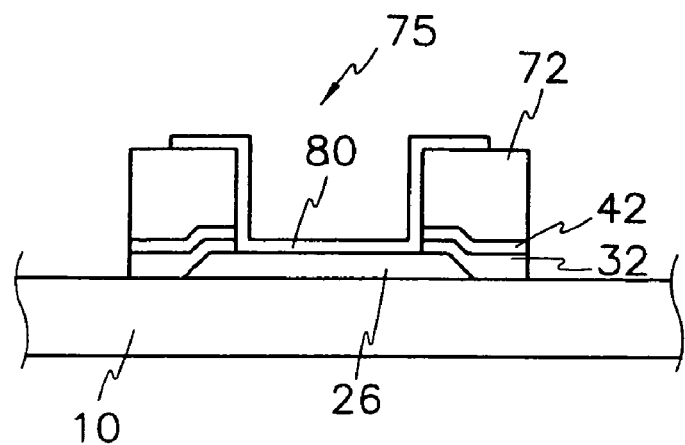
FIG. 3 is a cross-sectional view taken along line III-III of FIG. 1.
Figure 4:
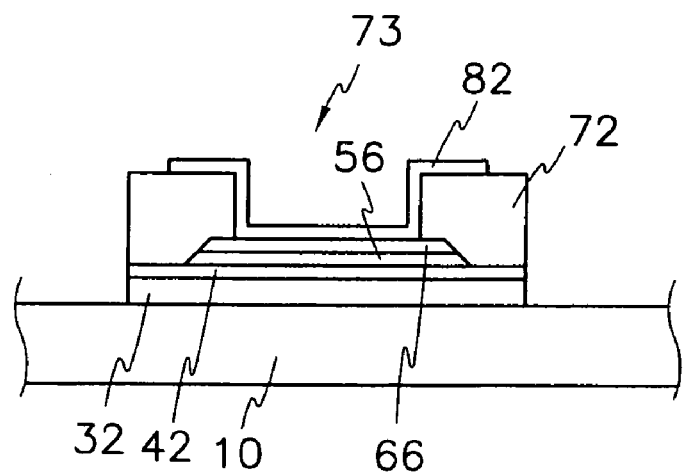
FIG. 4 is cross-sectional view taken along line IV-IV of FIG. 1.

FIG. 1 is a layout view of a thin film transistor array panel for a liquid crystal display according to the first embodiment of the present invention, and FIGS. 2, 3 and 4 are cross-sectional views taken along lines II-II, III-III and IV-IV of FIG. 1, respectively.

A gate wire and a storage wire, which are made of metal or conductive material such as aluminum. (AI) or aluminum alloy (Al alloy), molybdenum (Mo) or molybdenum-tungsten (MoW), and chromium (Cr), are formed on an insulating substrate 10. The gate wire includes a gate line (scanning signal line) 22 extending in the horizontal direction (in FIG. 1), a gate pad 26 connected to an end of the gate line 22 and transmitting a scanning signal from an external circuit to the gate line 22, and a gate electrode 24 that is a part of a thin film transistor. The storage wire includes a storage line 28 parallel with the gate line 22, a storage electrode 27 interconnecting the storage line 28 and the gate line 22, and a storage electrode 29 branched from the storage line 28. The storage wire forms a storage capacitance along with a pixel electrode 84, which will be described hereinafter. It is possible not to form the storage electrodes 27 and 29 if a storage capacitance between the pixel electrode 84 and the gate line 22 is sufficient.

The gate wire and the storage wire may have a multi-layered structure or a single-layered structure. When the gate wire and the storage wire are formed in a multi-layered structure, it is preferable that one layer is made of a material having a low resistivity and another layer is made of a material having a good contact with other materials. Double layers of Cr/Al (or Al alloy) and Al/Mo are examples of materials of such properties.

A gate insulating layer 32 of silicon-nitride (SiNx) and a semiconductor layer 42 of a semiconductor material such as hydrogenated amorphous silicon are formed on the gate wire and the storage wire to cover them. The gate insulating layer 32 and the semiconductor layer 42 are similar in shape to the gate wire and the storage wire.

An ohmic contact layer 52, 54 and 56 made of a material such as n+ amorphous silicon doped with N-type impurities of a high concentration is formed on the semiconductor layer 42. A data wire made of conductive materials such as Mo or MoW, Cr and Al or Al alloy is formed on the ohmic contact layer pattern 52, 54 and 56. The data wire includes a data line 62 extending in the vertical direction. (in FIG. 1) and has a source electrode of the TFT, a data pad 66 connected to an end of the data line 62 and transmitting image signals from an external circuit to the data line 62, and a drain electrode 64 located opposite to the source electrode 62 with respect to the gate electrode 24. The data wire and the ohmic contact layer pattern 52, 54 and 56 have the same shape.

The data wire may have a multi-layered structure like the gate wire. When the data wire has a multi-layered structure, it is preferable that one layer is made of a material having a low resistivity and another layer is made of a material having a good contact with other materials. The ohmic contact layer pattern 52, 54 and 56 serves to reduce the contact resistance between the semiconductor layer 42 and the data wire, and has the same layout as the data wire.

A protection layer 72 made of organic insulating material and covering the data wire is formed on the semiconductor layer 42. The protection layer 72 has contact holes 71 and 73 respectively exposing the drain electrode 64 and the data pad 66, and a contact hole 75 exposing the gate pad 26 along with the gate insulating layer 32 and the semiconductor layer 42.

The pixel electrode 84, which receives an image signal and generates an electric field with a common electrode of an upper panel, is formed on the substrate 10 of a pixel region defined by the gate line 22 and the data line 62. The pixel electrode 84 is made of a transparent conductive material such as ITO (indium tin oxide). The pixel electrode 84 is connected to the drain electrode 64 physically and electrically through the contact hole 71, and receives image signals from the drain electrode 64.

A redundant gate pad 80 and a redundant data pad 82 respectively connected to the gate pad 26 and the data pad 66 through the contact holes 75 and 73 are formed on the gate pad 26 and the data pad 66. Since these redundant pads 80 and 82 protect the pads 26 and 66 and provide additional adhesiveness between an external circuit and the pads 26 and 66, they are optional. The pixel electrode 84 overlaps the gate lines 22 and the storage wire to form a storage capacitance.

In this embodiment, although transparent ITO is used for the pixel electrode 82, an opaque-conductive material may be used in a reflective type LCD.

Furthermore, to prevent a parasitic channel from being formed on the gate line 22 and the storage line 28 when scanning signals are applied, the semiconductor layers 42 of adjacent pixel regions are separated by the gate line 22 and the storage line 28. If adjacent data lines 62 are electrically connected through the semiconductor layer 42, the parasitic channel in the semiconductor layer 42 may leak currents, and the image signals applied to the data lines 62 interfere with each other. Accordingly, the semiconductor layers 42 between adjacent data lines 62 must be separated from each other.

A method for manufacturing a thin film transistor array panel according to a first embodiment of the present invention will now be described with reference to the FIGS. 5A to 7D and FIGS. 1 to 4.

Figure 5A:
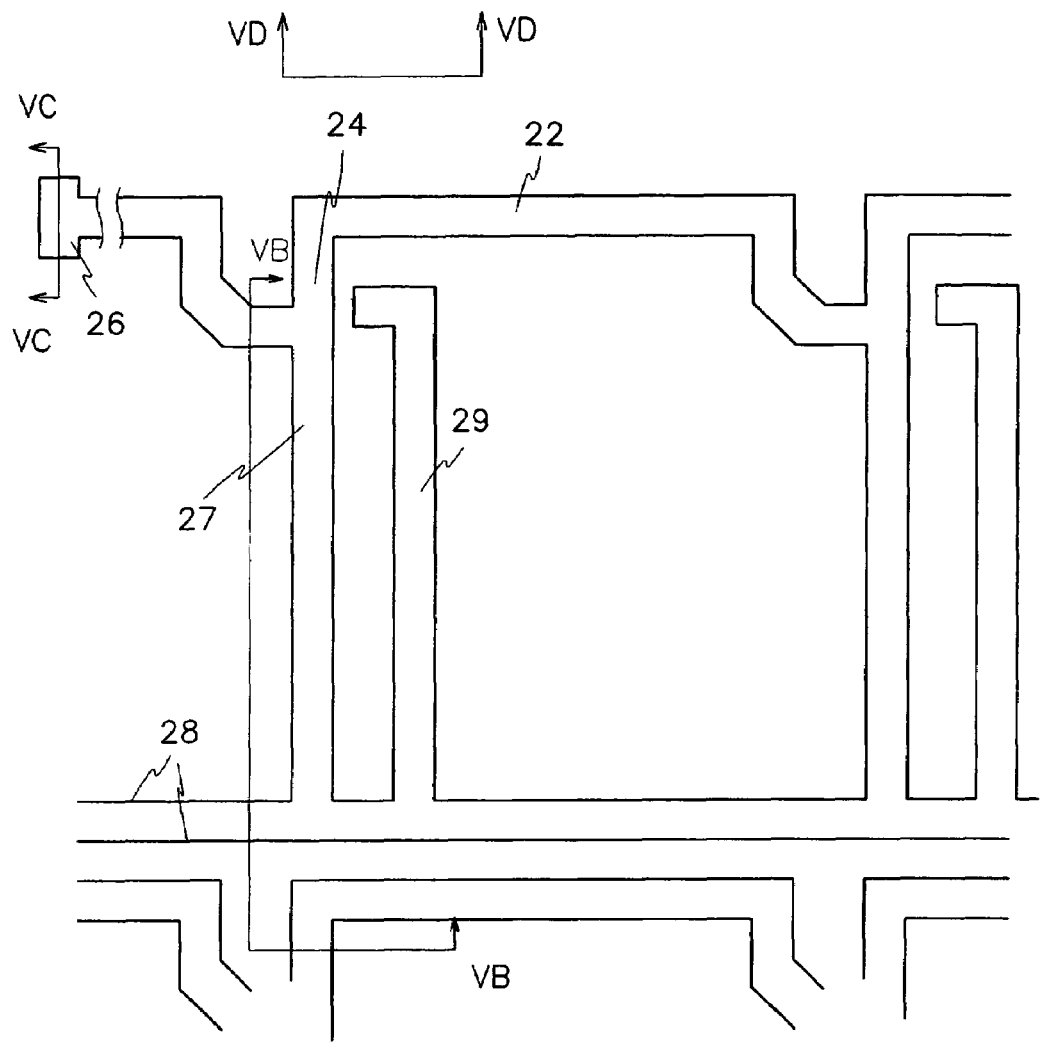
FIGS. 5A, 6A and 7A are layout views illustrating, in order, sequential steps of manufacturing a thin film transistor array panel according to a first embodiment of the present invention.
Figure 5B:
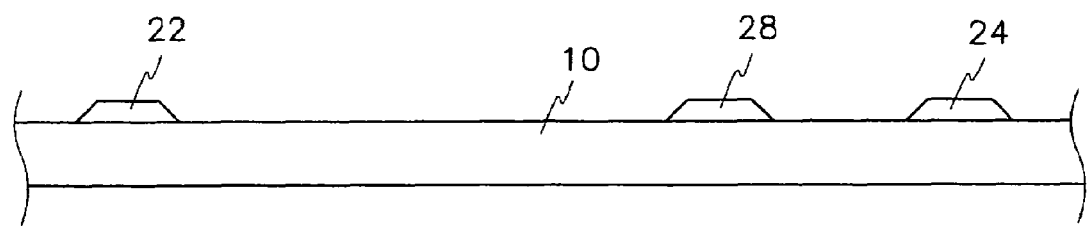
FIGS. 5B, 6B and 7B are cross-sectional views taken along lines VB-VB, VIB-VIB and VIIB-VIIB of FIGS. 5A, 6A and 7A, respectively.
Figure 5C:
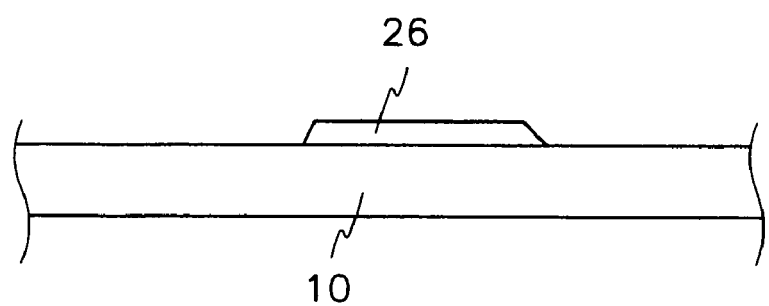
FIGS. 5C, 6C and 7C are cross-sectional views taken along lines VC-VC, VIC-VIC and VIIC-VIIC of FIGS. 5A, 6A and 7A, respectively.
Figure 5D:
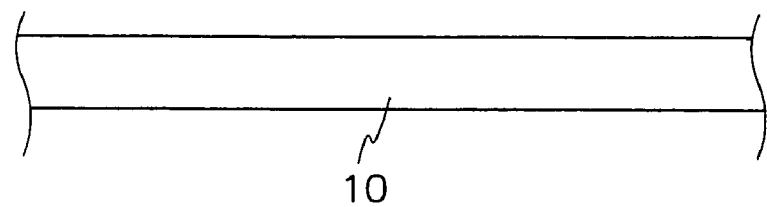
FIGS. 5D, 6D and 7D are cross-sectional views taken along lines VD-VD, VID-VID and VIID-VIID of FIGS. 5A, 6A and 7A, respectively.
Figure 6A:
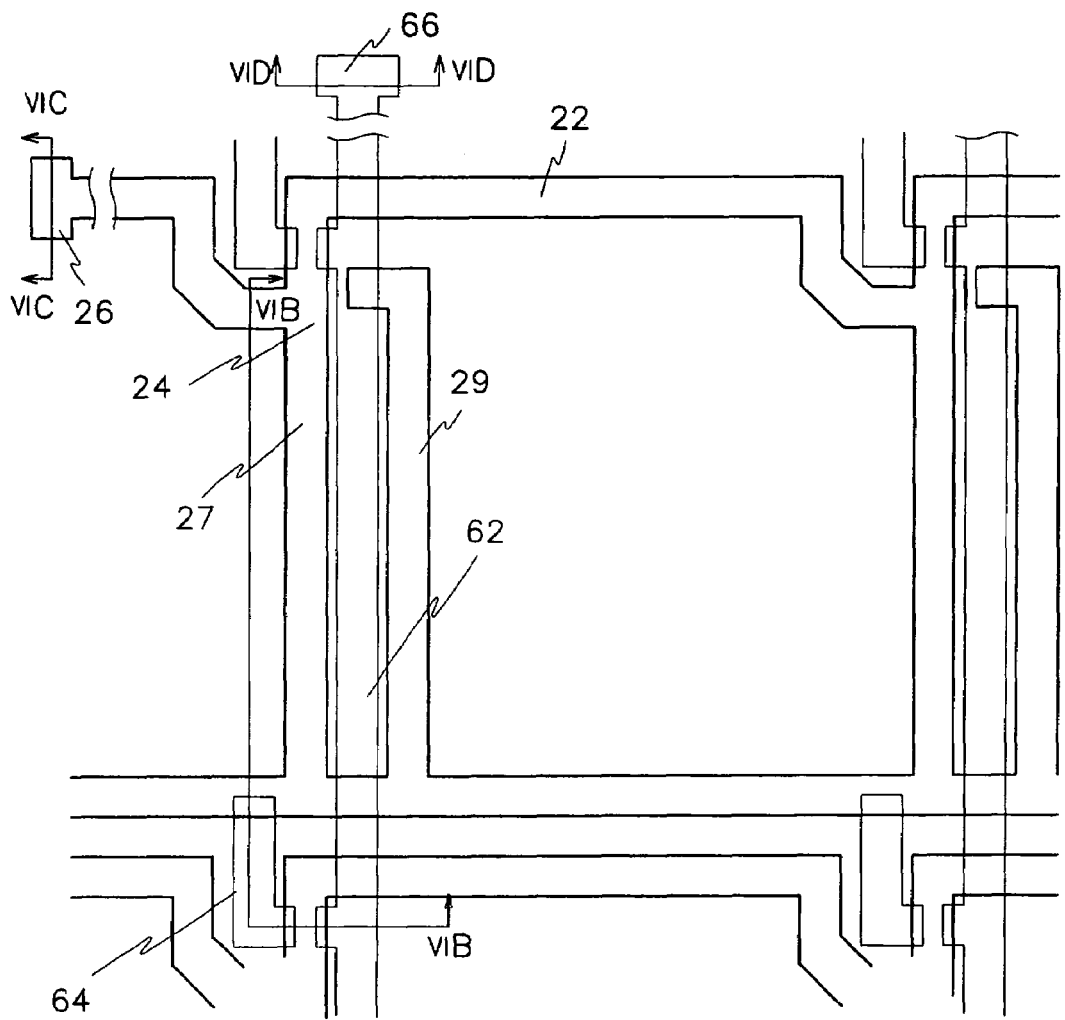
Figure 6B:
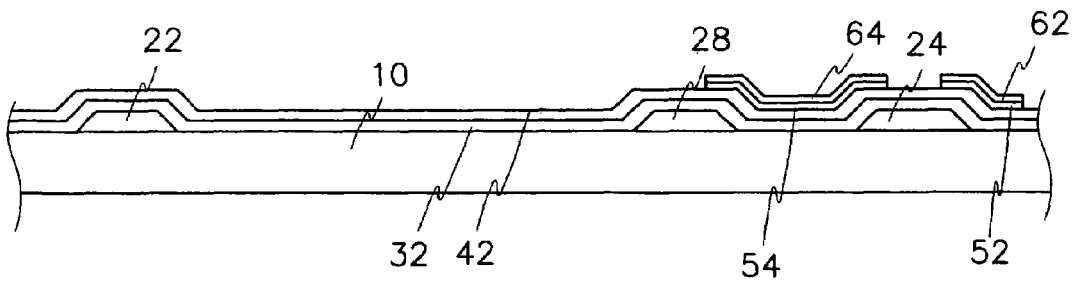
Figure 6C:
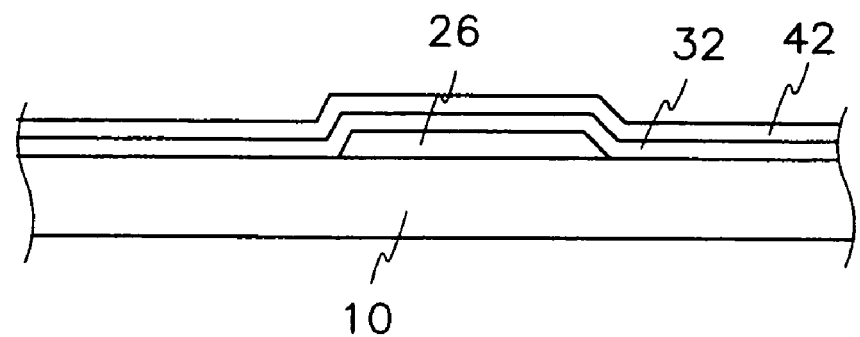
Figure 6D:
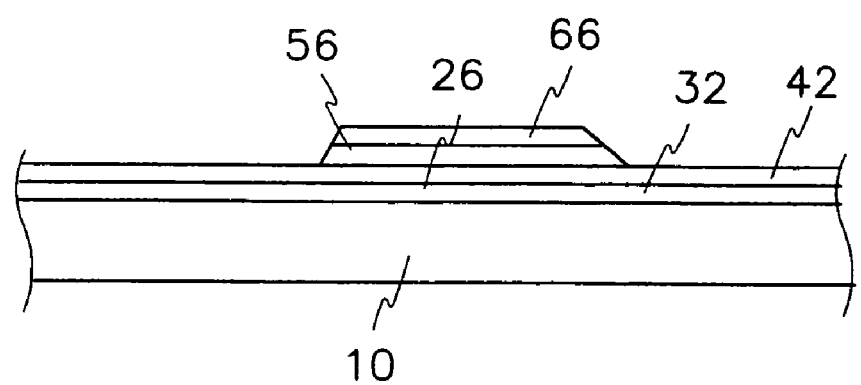
Figure 7A:
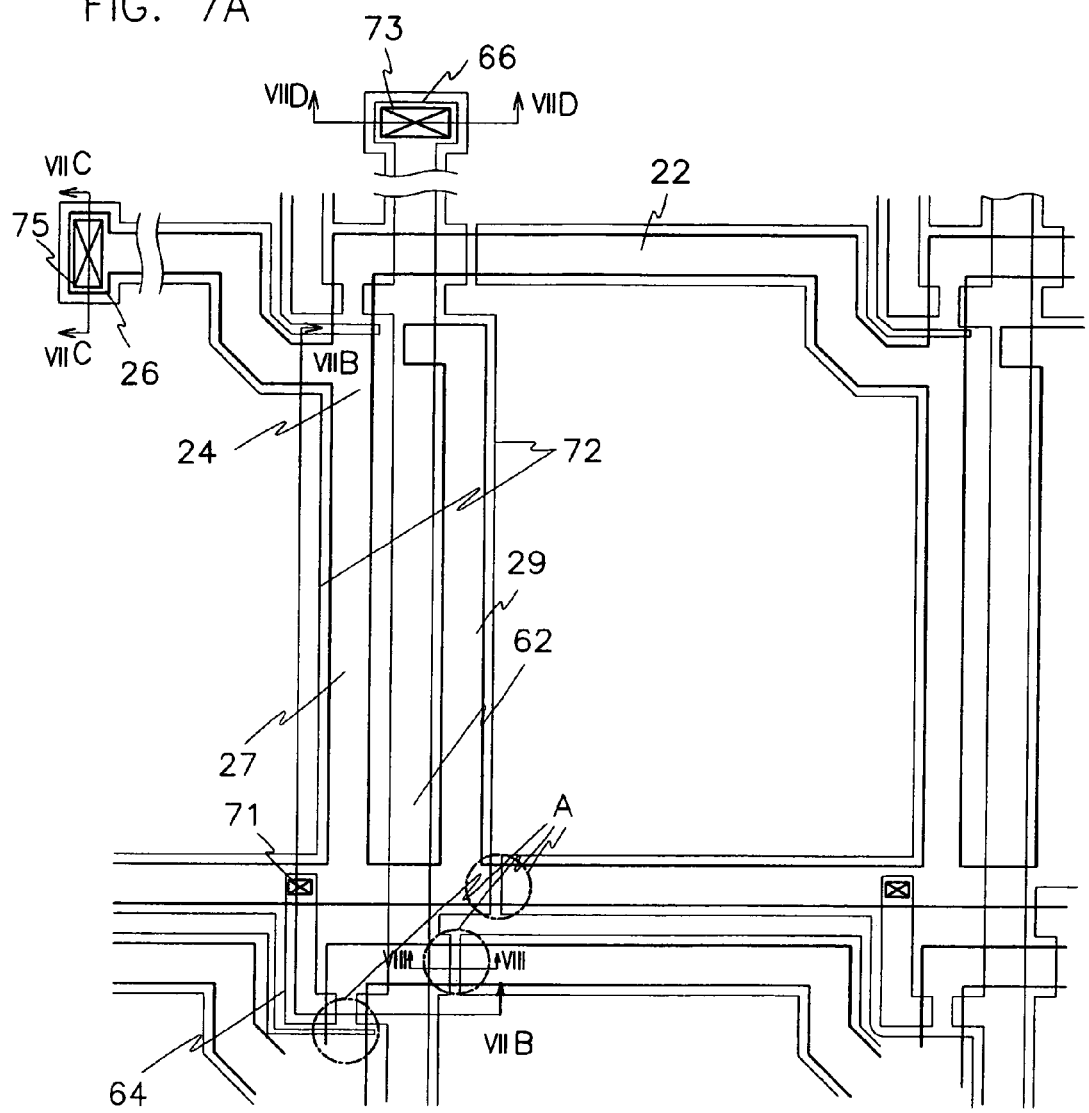
Figure 7B:
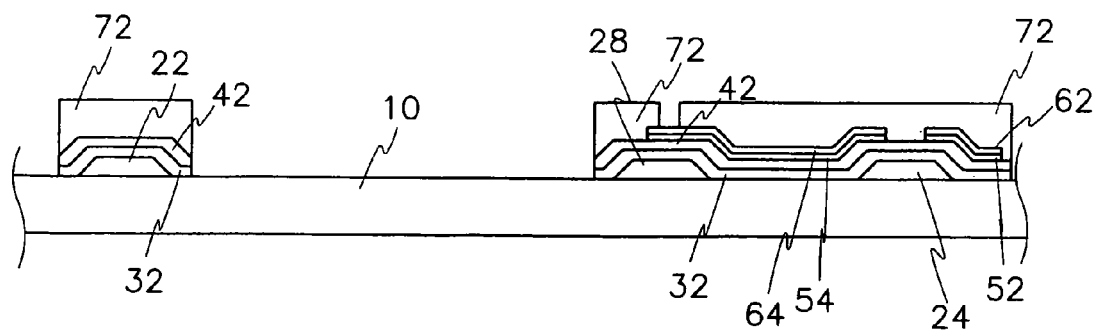
Figure 7C:
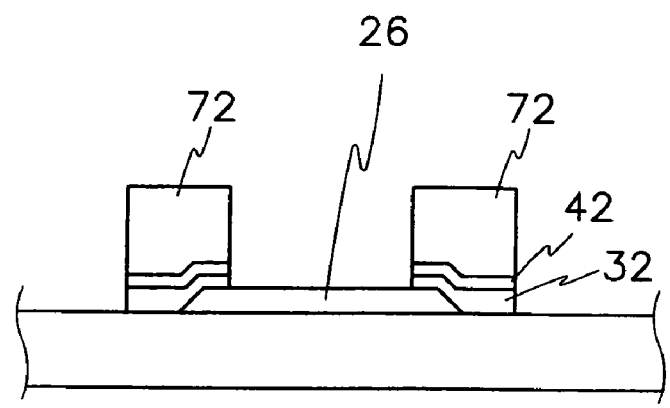
Figure 7D:
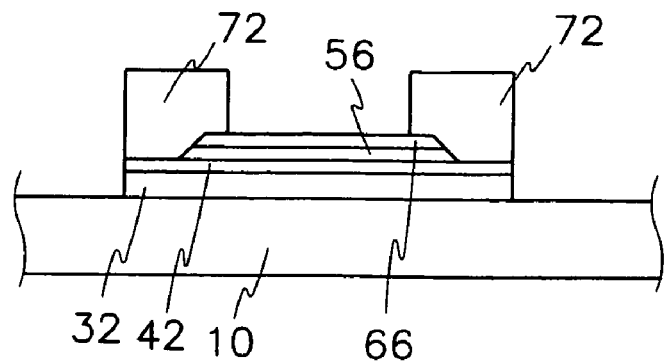

FIGS. 5A, 6A and 7A are layout views illustrating a method for manufacturing of a thin film transistor array panel according to the first embodiment of the present invention. FIGS. 5B, 6B and 7B show a TFT portion, a pixel portion and a storage portion. FIGS. 5C, 6C and 7C show a gate pad portion and FIGS. 5D, 6D and 7D show a data pad portion.

As shown in FIGS. 5A to 5D, a gate metal is deposited on a substrate 10 and patterned by a first photolithography process to form a gate wire including a gate line 22, a gate electrode 24 and a gate pad 26, and a storage wire including a storage line 28 and storage electrodes 27 and 29. As described previously, the gate wire and the storage wire are made of metal or conductive material such as aluminum (Al) or aluminum alloy, molybdenum (Mo) or molybdenum-tungsten (MoW), and chromium (Cr).

As shown in FIGS. 6A to 6D, following the above, a gate insulating layer 32 of silicon nitride, a semiconductor layer 42 of hydrogenated amorphous silicon, an amorphous silicon layer heavily doped with N-type impurities such as phosphorus, and a data metal layer are deposited in this order. Next, the data metal layer is patterned by a second photolithography process to form a data wire including a data line 62 having a source electrode, a drain electrode 64, and a data pad 66. Then, the doped amorphous silicon layer that is not covered by the data wire is etched to form an ohmic contact layer 52, 54, 56 under the data metal layer.

Next, as shown in FIGS. 7A to 7D, a photo-sensitive organic insulating layer is deposited and etched along with the gate insulating layer 32 and the semiconductor layer 42 by a third photolithography process to form a protection layer 72 having contact holes 71 and 73 exposing the drain electrode 64 and the data pad 66, and a contact hole 75 exposing the gate pad 26 along with the gate insulating layer 32, and the semiconductor layer 42. At this time, as shown in FIG. 7A, the protection layer 72, the semiconductor layer 42 and the gate insulating layer 32 cover (in an identical pattern) the gate wire, the storage wire, and the data wire, respectively. Here, a part of the protection layer 72 enclosing the data pad 66 and—having the contact hole 73 is different from parts of the gate insulating layer 32 and the semiconductor layer 42.

At this time, if amorphous silicon is left remaining on the gate line 22, gate electrode 24, and storage line 28, adjacent data lines 62 become electrically connected and data signals interfere with each other because of the current leakage between each pair of data lines 62. Accordingly, it is preferable that parts of the semiconductor layers 42 on the gate line 22, gate electrode 24, and storage line 28 are removed to separate adjacent data lines 62, i.e., to sever the electrical connection between adjacent data lines 62. This is realized by removing portions of the protection layer 72 and the semiconductor layer 42 corresponding to portions A in FIG. 7A. However, because the contact hole 75 must be simultaneously formed, the portion of the gate line 22, gate electrode 24, and storage line 28 corresponding to portions A are exposed. At this time, by a reflow process, the gate insulating layer 32 or the protection layer 72 may cover the gate line 22, gate electrode 24, and storage line 28 at areas corresponding to portions A, preventing the exposure of gate wire in these areas. This will be described in detail hereinafter. At this time, a profile of the protection layer 72 may be sloped.

First, a method for covering with the protection layer 72 the gate line 22, gate electrode 24, and storage wire 28 through a reflow process will be described in detail.

Figure 8A:
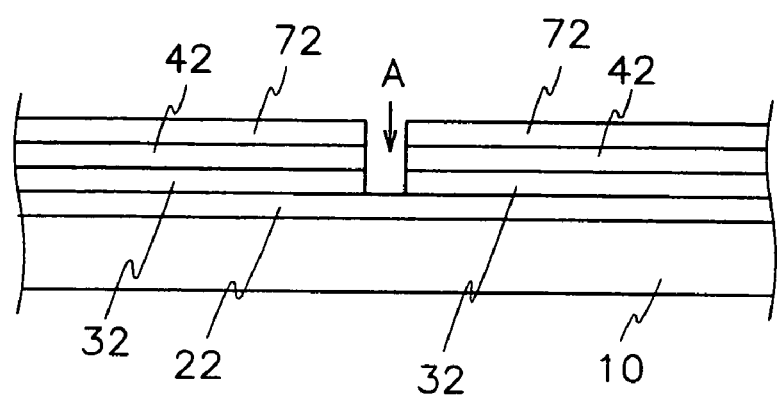
FIGS. 8A-8B and 9A-9C are cross-sectional views taken along line VIII-VIII of FIG. 7A.
Figure 8B:
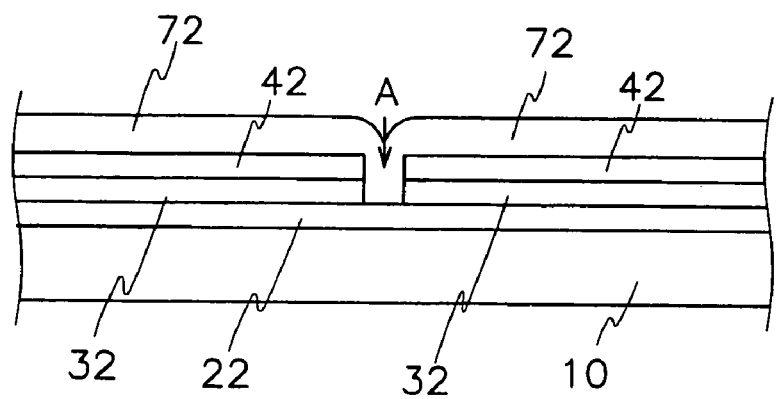

FIGS. 8A and 8B are the cross-sectional views taken along line VIII-VIII of portion A in FIG. 7A. FIG. 8A is a cross-sectional view before a reflow process, and FIG. 8B is a cross-sectional view after the reflow process.

As shown in FIG. 8A, when forming the contact holes 75, 73 and 71 exposing the gate pad 26, the data pad 66 and the drain electrode 64, respectively, the gate line 22 is exposed by removing the protection layer 72, the semiconductor layer 42 and the gate insulating layer 32 corresponding to portions A to remove the semiconductor layer 42 under adjacent data lines 62. Because the etch selectivity of the data metal layer prevents further etching, the semiconductor layer and the gate insulating layer underlying the data pad 66 and the drain electrode 64 are not removed.

Next, as shown in FIG. 8B, by the reflow process, the parts of the protection layer 72, which is made of organic and reflowable material, flow into opening A, and the gate line 22 is covered with the protection layer 72. This method is used when the protection layer 72 is made of organic and reflowable material.

Figure 9A:
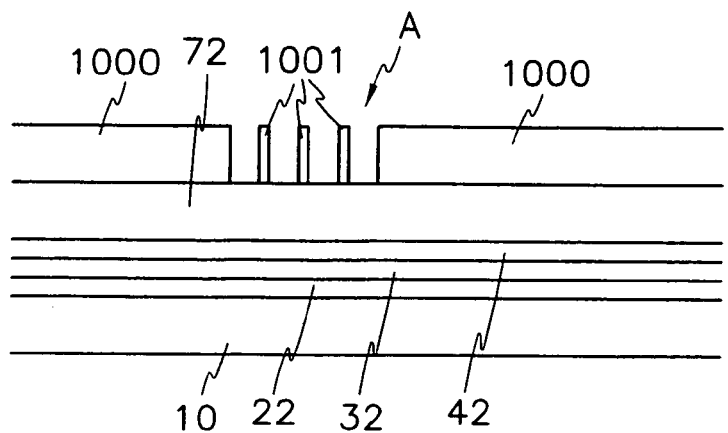
Figure 9B:
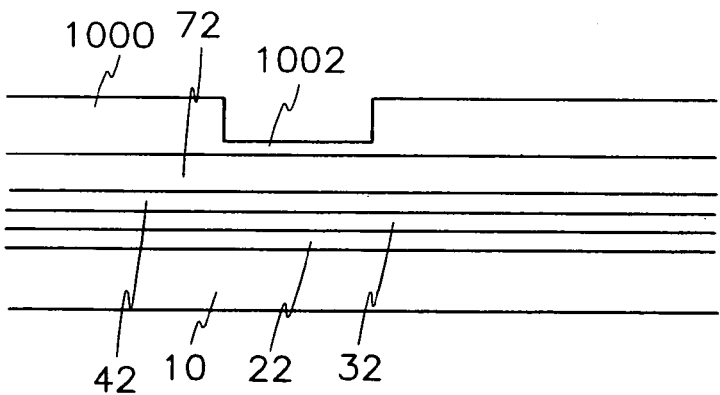
Figure 9C:
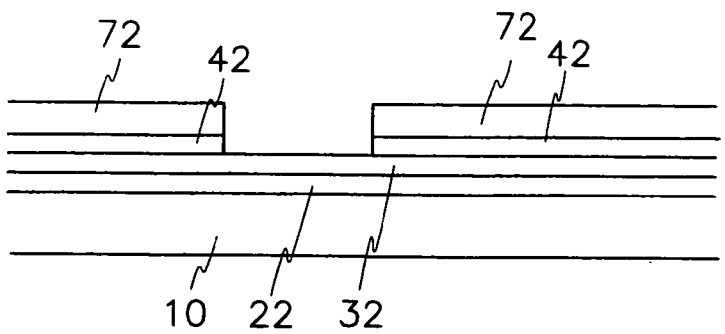

A method for leaving the gate insulating layer 32 intact on the gate line 22, gate electrode 24, and storage wire 28 through a reflow process will now be described in detail. FIGS. 9A to 9C are cross-sectional views taken along line VIII-VIII, of portion A in FIG. 7A. FIG. 9A is a cross-sectional view before a reflow process. FIG. 9B is a cross-sectional view after the reflow process and FIG. 9C is a cross-sectional view after an etch process.

As shown in FIG. 9A, formed in a third photolithography process are a photoresist pattern 1000 having an opening A on the gate line 22 and a plurality of minute patterns 1001 provided on the protection layer 72 in the opening A.

Next, if the reflow process is executed, as shown in FIG. 9B, the minute patterns 1001 are reflowed into the opening A, and a photoresist layer 1002 is formed on the protection layer 72 corresponding to the position of the opening A.

Next, as shown in FIG. 9C, the protection layer 72, the semiconductor layer 42 and the gate insulating layer 32 are etched to expose the gate pad 26 (see FIG. 7C). At this time, although the protection layer 72 and the semiconductor layer 42 come to be divided into two portions with respect to opening A, the gate insulating layer 32 covering the gate line 22 is not divided, because of the photoresist layer 1002 formed in opening A.

By using minute patterns of reflowable photoresist as described above, even if the substrate 10 at pixel regions and the gate pad 26 at pad portions are exposed, the gate insulating layer 32 over the gate line 22, gate electrode 24, and storage line 28 remain intact.

At this time, it is preferable that the amorphous silicon of opening A is completely removed by controlling the thickness of the photoresist layer 1002. If the photoresist layer 1002 is thin, the portion of the gate insulating layer 32 in opening A may be etched. In this method, the reflowable photoresist 1000, 1001 and 1002 is used rather than the reflowable protection layer 72 of the previous method. However, when the reflowable protection layer 72 is used as in the previous method, minute patterns are formed as the protection layer and reflowed such that a thin layer is formed as a protection layer in the opening A, thereby leaving the gate insulating 32 intact.

This method of using a reflow process for a selective etching may be used for manufacturing other semiconductor devices. That is, one etch process may not expose the storage line 28, gate line 22, and gate electrode 24 in one area while exposing the substrate 10 and the gate pad 26 in the other area.

Subsequently, aluminum and aluminum alloy not covered by the protection layer 72 and exposed such as the gate pad 26, are removed by performing an etch process over an entire surface to improve contact quality with indium tin oxide (ITO). When the gate wire is made of aluminum or aluminum alloy of the upper layer, and the lower layer of chromium, molybdenum or molybdenum alloy, the lower layer of chromium, molybdenum or molybdenum alloy of the gate pad 26 is exposed.

Next, as shown in FIGS. 1 to 4, indium tin oxide (ITO) is deposited and patterned by fourth photolithography processes to form a pixel electrode 84 connected to the drain electrode 64, a redundant gate pad 80 connected to the gate pad 26 and a redundant data pad 82 connected to the data pad 66 through the contact hole 71, 75 and 73. The pixel electrode 84, the redundant gate pad 80 and the redundant data pad 82 contact with chromium, molybdenum or molybdenum alloy of the drain electrode 64, the gate pad 26 and the data pad 66.

In the first embodiment of the present invention, the pad portion has a dual-layered structure including the upper layer of ITO and the lower layer of chromium, molybdenum or molybdenum alloy. When the pad portion is a triple-layered structure, a conductive layer made of aluminum or aluminum alloy may be provided.

In the previous embodiment, the protection layer and the semiconductor layer are simultaneously patterned to reduce the number of masks. However, severe step coverage makes the upper layers structurally weak. To overcome this problem, it is preferable that a lower layer be formed to extend past outside an upper layer. This will be described in detail hereinafter.

First, the structure of a thin film transistor array panel for a liquid crystal display according to a second embodiment of the present invention will be described with reference to FIGS. 10 to 11.

Figure 10:
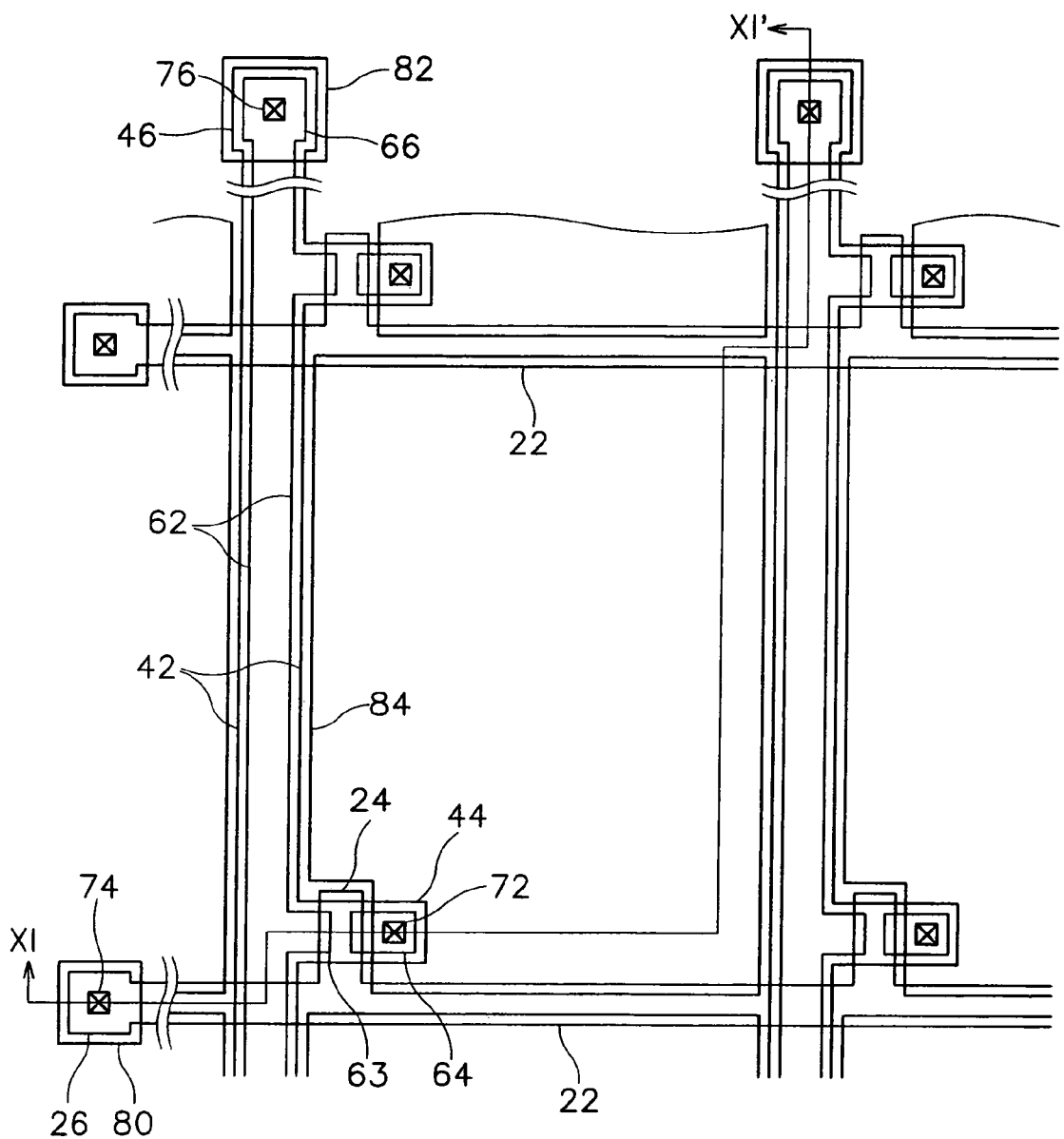
FIG. 10 is a layout view of a thin film transistor array panel for a liquid crystal display according to a second embodiment of the present invention.
Figure 11:
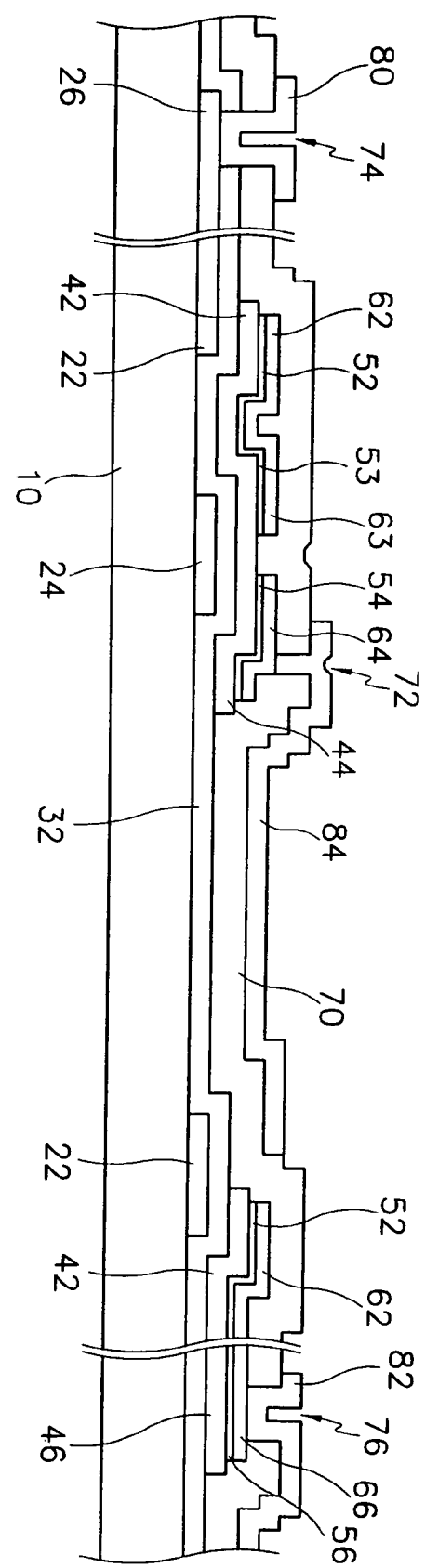
FIG. 11 is a cross-sectional view taken along line XI-XI of FIG. 10.

FIG. 10 is a layout view of a thin film transistor array panel for a liquid crystal display according to the second embodiment of the present invention, and FIG. 11 is a cross-sectional view taken along line XI-XI of FIG. 10.

A gate wire and a storage wire, which are made of conductive material such as aluminum (Al) or aluminum alloy, molybdenum (Mo) or molybdenum-tungsten (MoW), and chromium (Cr), are formed on an insulating substrate 10. The gate wire includes a gate line (scanning signal line) 22 extending in the horizontal direction (in FIG. 10), a gate pad 26 connected to an end of the gate line 22 and transmitting a scanning signal from an external circuit to the gate line 22, and a gate electrode 24 that is a part of a thin film transistor. The gate line 22 forms a storage capacitance along with a pixel electrode 84, which will be described hereinafter. Storage electrodes overlapping the pixel electrode 84 may be provided if the storage capacitance between the pixel electrode 84 and the gate line 22 is not sufficient.

The gate wire may have a multi-layered structure or a single-layered structure. When the gate wire has a multi-layered structure, it is preferable that one layer is made of a material having a low resistivity and another layer is made of a material having a good contact with other materials. Double layers of Cr l Al (or Al alloy) and Al/Mo are such examples.

A gate insulating layer 32 of silicon-nitride (SiNx) covers the gate wire.

A semiconductor pattern 42, 44 and 46 made of such a material as hydrogenated amorphous silicon is formed on the gate insulating layer 30. An ohmic contact pattern 52, 53, 54 and 56 of a material such as n+ silicon amorphous hydride doped with N-type impurities at a high concentration is formed on the semiconductor pattern 42, 44 and 46.

A data wire made of conductive materials such as Mo or MoW, Cr, Al or Al alloy and Ta is formed on the ohmic contact pattern 52, 53, 54 and 56. The data wire includes a data line 62 extending in the vertical direction (in FIG. 10), a data pad 66 connected to an end of the data line 62 and transmitting image signals from an external circuit to the data line 62, a source electrode 63 that is a part of a thin film transistor and branched from the data line 62, and a drain electrode 64 located opposite to the source electrode 63 with respect to the gate electrode 24.

The data wire may have a multi-layered structure like the gate wire. When the data wire has a multi-layered structure, it is preferable that one layer is made of a material having a low resistivity and another layer is made of a material having a good contact with other materials.

The ohmic contact layer pattern 52, 53, 54 and 56 reduces the contact resistance between the semiconductor pattern 42, 44 and 46 and the data wire, having the same layout as the data wire. Here, an edge of the semiconductor pattern 42, 44 and 46 is extended outside the data wire 62, 63, 64 and 66, and a channel of the thin film transistor is formed in the semiconductor pattern 42, 44 and 46 between the source electrode 63 and the drain electrode 64.

A protection layer 70 made of silicon-nitride (SiNx) or organic insulating material is formed on the gate insulating layer 32 to cover the data wire and the semiconductor pattern 42, 44 and 46. The protection layer 70 has contact holes 72 and 76 respectively exposing the drain electrode 64 and the data pad 66, and a contact hole 74 exposing the gate pad 26.

The pixel electrode 84, which receives an image signal and generates an electric field in cooperation with a common electrode of an upper panel, is formed on the protection layer 70 of a pixel region defined by the gate line 22 and the data line 62. The pixel electrode 84 is made of a transparent conductive material such as ITO (indium tin oxide). The pixel electrode 84 is connected to the drain electrode 64 physically and electrically through the contact hole 72, and receives image signals from the drain electrode 64.

A redundant gate pad 80 and a redundant data pad 82 respectively connected to the gate pad 26 and the data pad 66 through the contact holes 74 and 76 are formed on the gate pad 26 and the data pad 66. Since these redundant pads 80 and 82 protect the pads 26 and 66 and provide additional adhesiveness between an external circuit and the pads 26 and 66, they are optional. The pixel electrode 84 overlaps the gate line 22 to form a storage capacitance.

In this embodiment, although transparent ITO is taken as an example of the material of the pixel electrode 82, it is possible to use an opaque-conductive material in a reflective type LCD.

A manufacturing method of a thin film transistor array panel according to a second embodiment of the present invention will now be described with reference to the FIGS. 12A to 16B and FIGS. 10 to 11.

Figure 12A:
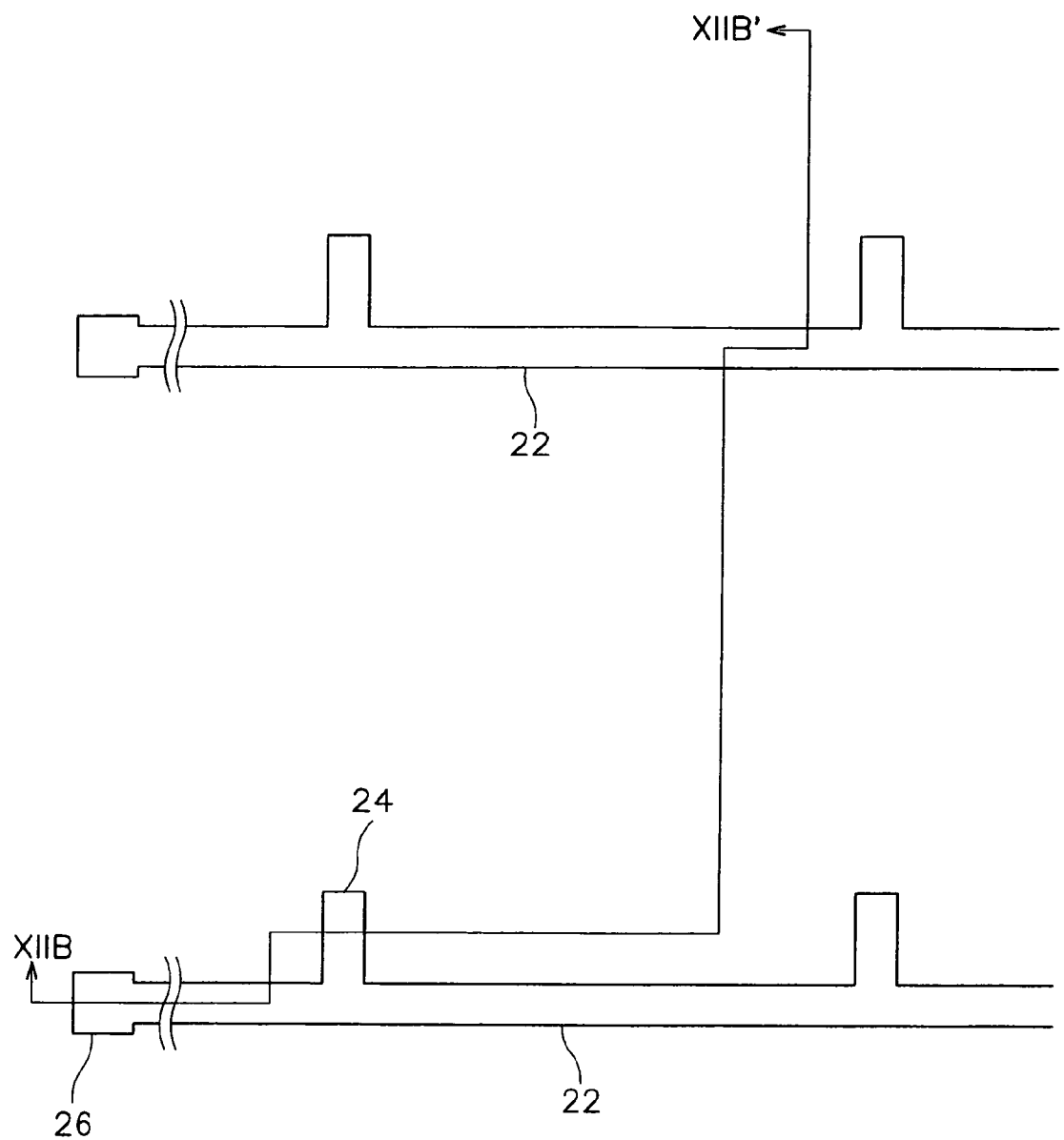
FIG. 12A is a layout view illustrating a first step in manufacturing a thin film transistor array panel according to the second embodiment of the present invention.
Figure 12B:
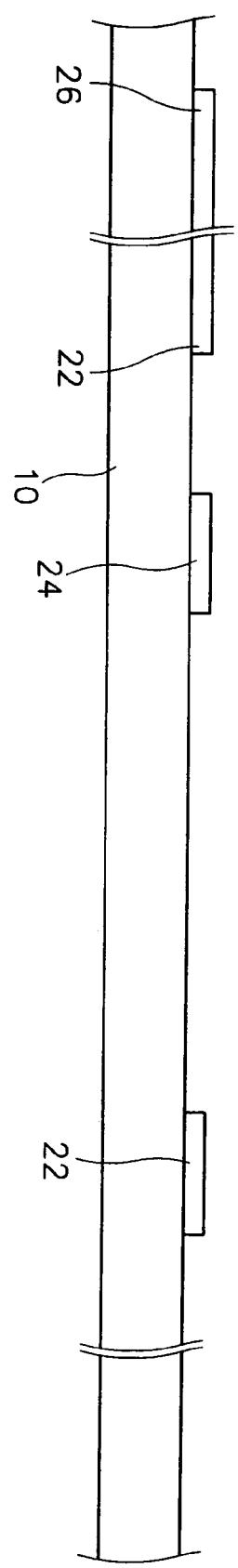
FIG. 12B is a cross-sectional view taken along the line XIIB-XIIB' of FIG. 12A.

First, as shown in FIGS. 12A and 12B, a conductive layer of material such as metal is deposited on a substrate 10 with a thickness of 1,000 to 3,000 Å by using a sputtering deposition method, and patterned by a first photolithography process by using a wet or dry etch process to form a gate wire including a gate line 22, a gate electrode 24 and a gate pad 26.

Figure 13:
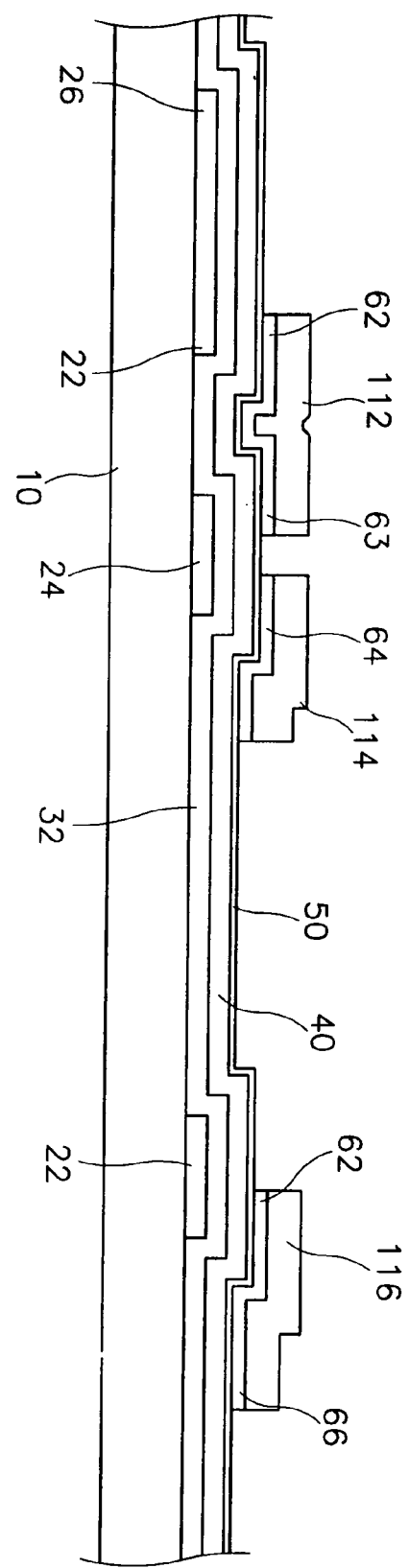
FIGS. 13 and 14 are cross-sectional views illustrating manufacturing steps following that of FIG. 12A taken along the line XIIB-XIIB' of FIG. 12A

Next, as shown in FIG. 13, a gate insulating layer 32 of silicon nitride with a thickness of 1,500 to 5,000 Å, a semiconductor layer 42 made of hydrogenated amorphous silicon with a thickness of 500 to 2,000 Å, and a doped amorphous silicon layer heavily doped with impurities such as phosphorus with a thickness of 300 to 600 Å are deposited, in this order, by a chemical vapor deposition process.

Then, a conductive layer of material such as metal is deposited with a thickness of 1,500 to 3,000 Å by using a sputtering deposition method, and photoresist is coated with a thickness of 10,000 to 20,000 Å on the conductive layer. The photoresist is exposed and developed using a second mask, which is used for a data wire, to form a photoresist pattern 112, 114 and 116. The portion of the conductive layer not covered by the photoresist pattern 112, 114, 116 is etched to form a data wire, the data wire including a data line 62, a source electrode 63, a drain electrode 64 and a data pad 66 on the doped amorphous silicon layer.

Figure 14:
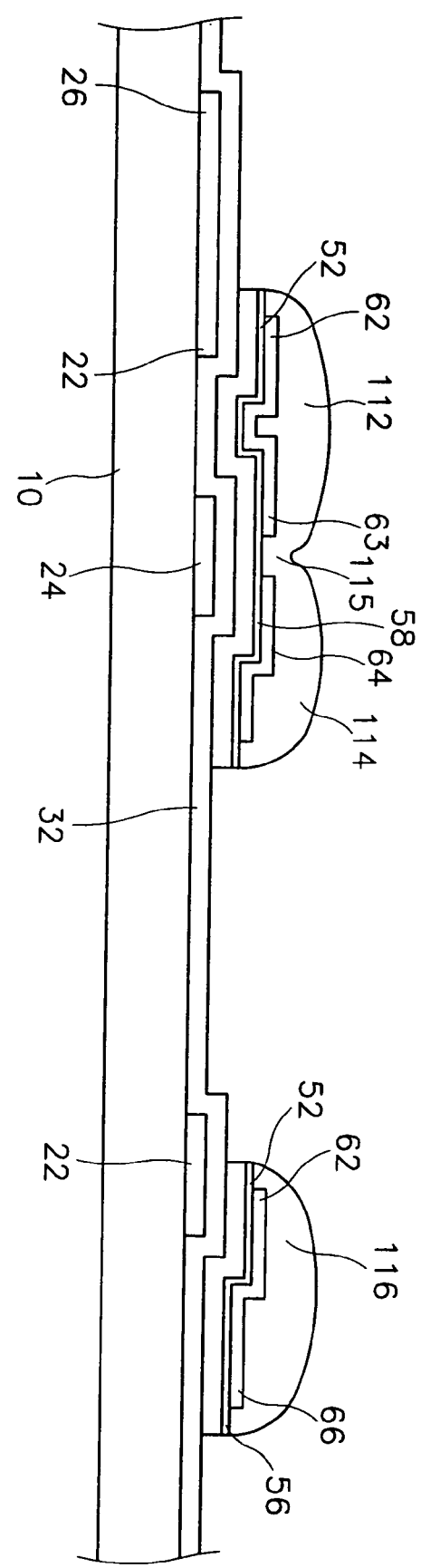

Next, as shown in FIG. 14, the photoresist pattern 112, 114 and 116 is reflowed such that a new photoresist pattern 115 covering the doped amorphous silicon 50 between the source electrode 63 and the drain electrode 64 is formed, and a periphery of the data wire is completely covered by the photoresist pattern 112, 114 and 116. Subsequently, portions of the doped amorphous silicon layer 50 and the amorphous silicon layer 40 not covered by the data wire 62, 64 and 66 are etched to form an ohmic contact layer 52, 56, and 58 and a semiconductor pattern 42, 44 and 46 to be extended outside the data wire 62, 64 and 66.

Next, the photoresist pattern 112, 114, 115 and 116 is removed, and also removed is the doped amorphous silicon layer not covered by the data wire such that the ohmic contact layer 58 under the source and drain electrodes 63 and 64 is divided into two portions 53 and 54, thereby exposing the semiconductor pattern 44 between the source and drain electrodes 63 and 64. At this time, the ohmic contact layer pattern 52, 53, 54 and 56 and the data wire have the same layout.

Here, as shown in FIG. 14, because portions of the photoresist pattern 112, 114, 115 and 116 corresponding to where the ohmic contact layer 52, 56 and 58 is not covered by the data wire 62, 63, 64 and 66, are thinner than other portions of the photoresist pattern 112, 114, 115 and 116, it is possible to change the order of the above method and remove the first amorphous silicon layer not covered by the data wire, after which the photoresist pattern 112, 114, 115 and, 116 is removed. In this etch process, both dry or wet etch methods can be used, and it is preferable that etching is performed under the condition where the data wire and the gate insulating layer 32 are not easily etched, while the photoresist pattern 112, 114, 115 and 116 and the amorphous silicon layer are easily etched.

Figure 15A:
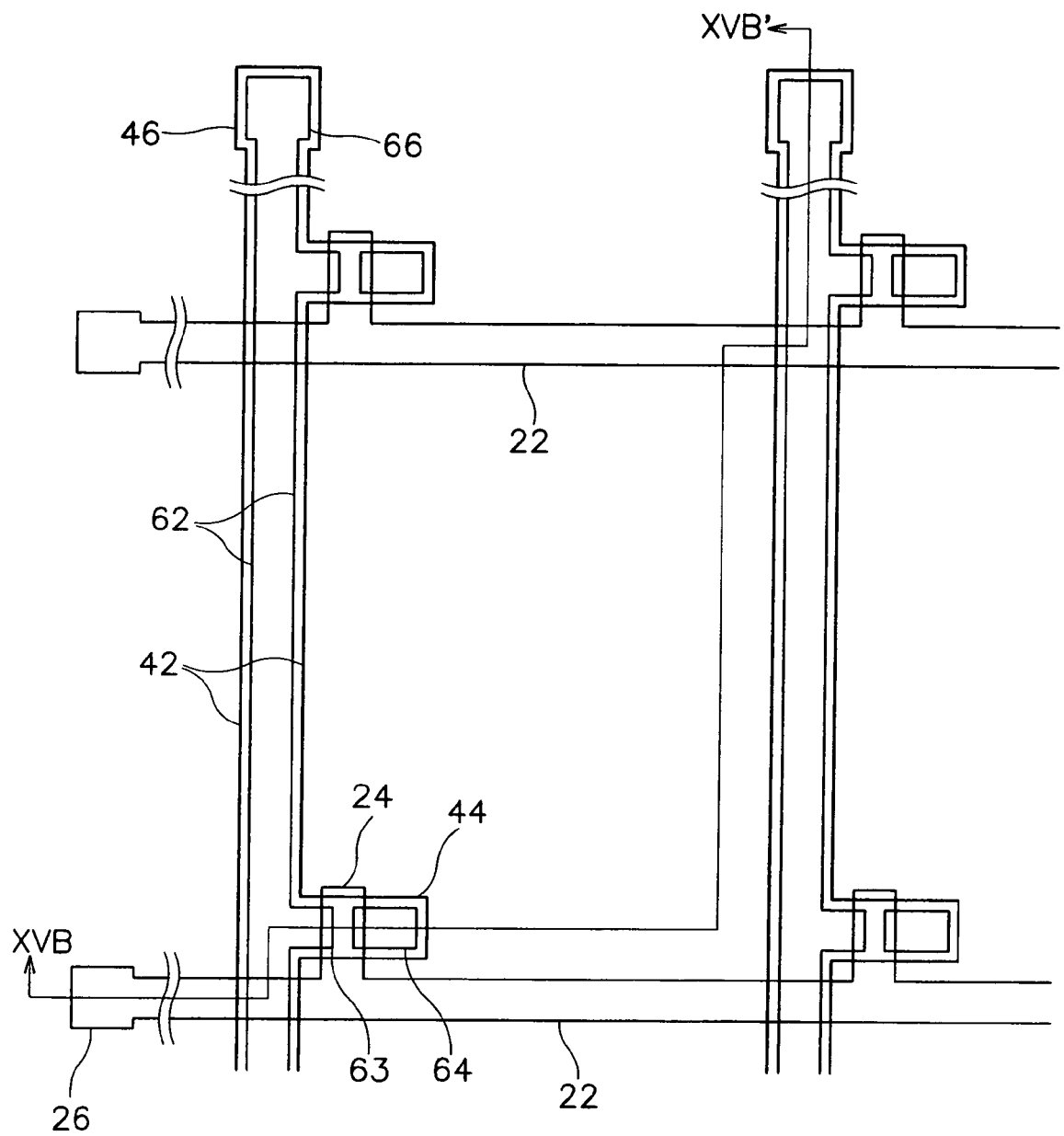
FIG. 15A is a layout view illustrating the thin film transistor array panel in a manufacturing step following that of FIG. 14.
Figure 15B:
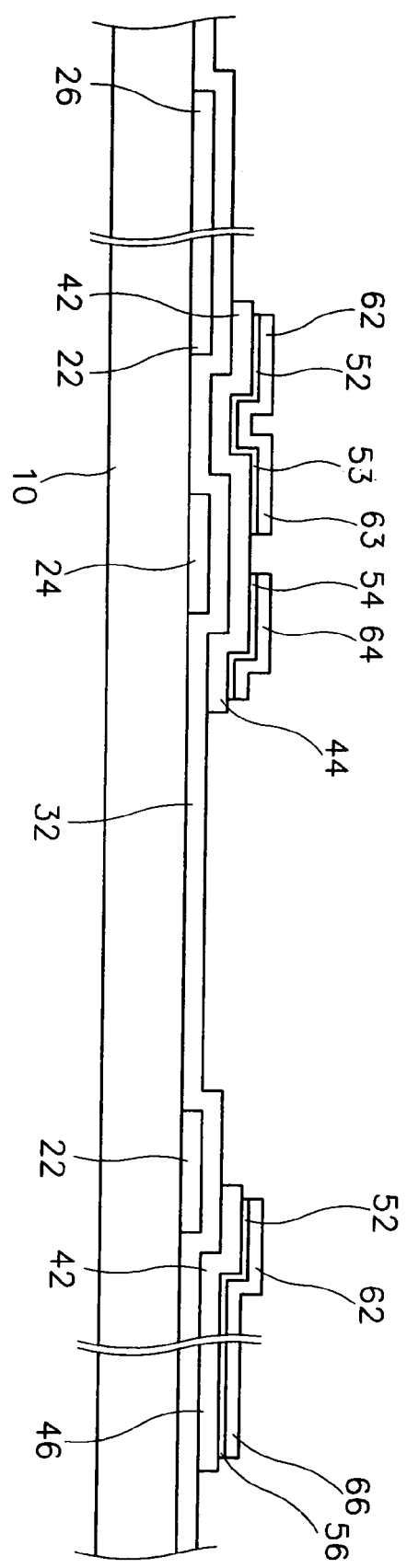
FIG. 15B is a cross-sectional view taken along line XVB-XVB' of FIG. 15A.

Furthermore, after the data wire 62, 63, 64 and 66 is formed, the exposed doped amorphous silicon layer is etched to form the ohmic contact layer 52, 53, 54 and 56 (see FIG. 15B).

Figure 16A:
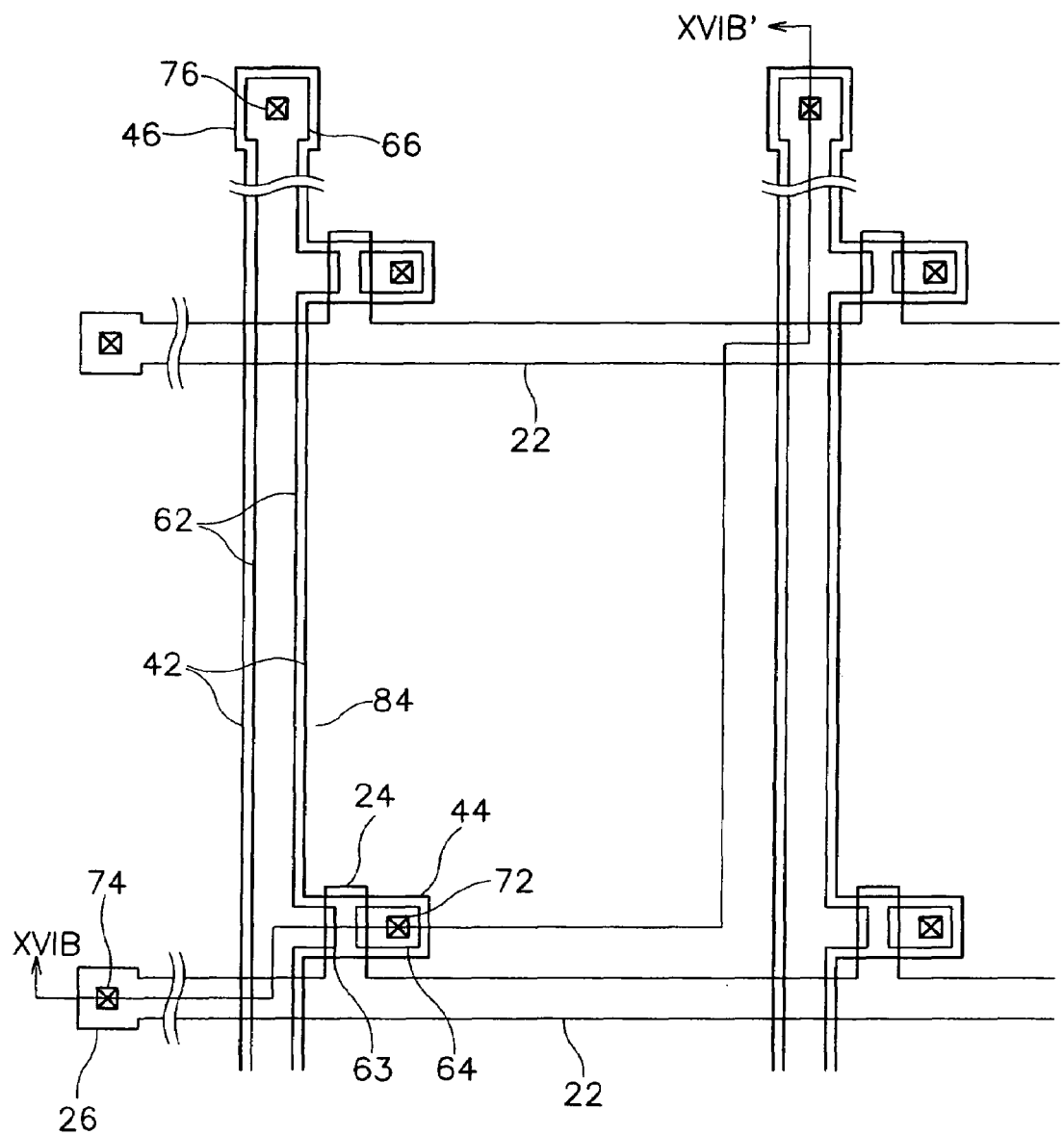
FIG. 16A is a layout view illustrating the thin film transistor array panel in a manufacturing step following that of FIG. 15A.
Figure 16B:
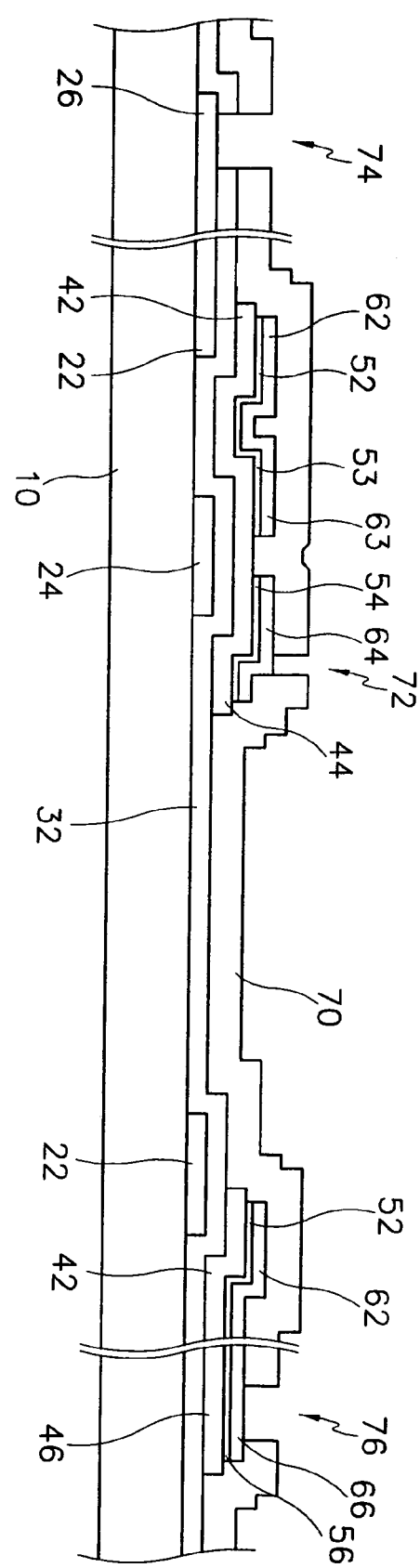
FIG. 16B is a cross-sectional view taken along line XVIB-XVIB' of FIG. 16A.

Next, as shown in FIGS. 16A and 16B, an organic insulating material is coated by using a spin coating method or silicon nitride is deposited by using a chemical vapor deposition method to form a protection layer 70 with a thickness of more than 3,000 Å. Subsequently, the protection layer 70 is etched along with the gate insulating layer 32 and the semiconductor layer 42 by a third photolithography process to form contact holes 72, 76 and 74 respectively exposing the drain electrode 64, data pad 66, and gate pad 26.

Finally, as shown in FIGS. 10 to 11, indium tin oxide (ITO) is deposited and patterned by a fourth photolithography process to form a pixel electrode 84 connected to the drain electrode 64 through the contact hole 72, a redundant gate pad 80 connected to the gate pad 26 through the contact hole 74, and a redundant data pad 82 connected to the data pad 66 through the contact hole 76.

In this embodiment according to the present invention, the data wire, the ohmic contact layer 52, 53, 54 and 56, and the semiconductor pattern 42, 44 and 46 are formed by using a single mask, thereby minimizing the total number of masks required. Further, the semiconductor pattern 42, 44 and 46 is formed extending outside the data wire such that the step coverage of the triple layer, realized through the data wire, the ohmic contact layer 52, 53, 54 and 56, and the semiconductor pattern 42, 44 and 46, is formed in two steps. Accordingly, the structure of the protection layer 70 and the pixel electrode 84 may become less fragile.

This method may also be adapted to the first embodiment. The photoresist pattern to form the protection layer is reflowed and the reflowed photoresist pattern can be used to etch the semiconductor layer or the gate insulating layer.

In the present invention, the manufacturing process of a thin film transistor panel for a liquid crystal display is simplified by reducing the number of masks required in the process. As a result, manufacturing costs may be minimized. The leakage of current from the liquid crystal display can also be reduced, and the step coverage of the layers is strengthened.

What is claimed is:

1. A thin film transistor array panel, comprising:
   a gate wire including a plurality of gate lines, a plurality of gate electrodes, and a plurality of gate pads and formed on an insulating substrate;
   a gate insulating layer covering the gate wire;
   a semiconductor layer formed on the gate insulating layer;
   an ohmic contact layer formed on the semiconductor layer;
   a data wire formed on the ohmic contact layer, wherein the data wire includes a plurality of data lines intersecting the gate lines, a plurality of source electrodes connected to the data lines and extending onto the gate electrodes, a plurality of drain electrodes located opposite the source electrodes with the gate electrodes therebetween and a plurality of data pads;
   a protection layer formed on the data wire and the semiconductor layer, and having a plurality of first contact holes exposing the drain electrodes; and
   a plurality of pixel electrodes connected to the drain electrodes through the first contact holes formed directly over a storage wire formed on the substrate,
   wherein the ohmic contact layer extends substantially along the data lines, the gate wire has a taper structure, and the protection layer covers the semiconductor layer between the source electrode and the drain electrode, and each of the pixel electrodes overlaps its own gate line.

2. The thin film transistor array panel of claim 1, wherein the ohmic contact layer has substantially the same planar shape as the data wire.

3. The thin film transistor array panel of claim 2, wherein the portion of the data pad and the ohmic contact layer on the portion of the data line has a taper structure.

4. The thin film transistor array panel of claim 1, wherein the protection layer have a plurality of second contact holes and a plurality of third contact holes respectively exposing portions of the gate line and the data lines.

5. The thin film transistor array panel of claim 4, further comprising:
   a plurality of redundant gate pads respectively connected to the gate lines through the second contact holes, and
   a plurality of redundant data pads respectively connected to the data lines through the third contact holes.

6. The thin film transistor array panel of claim 5, wherein the redundant gate pads and the redundant data pads are formed with the same layer as the pixel electrodes.

7. The thin film transistor array panel of claim 1, wherein the semiconductor layer, the gate insulating layer and the protection layer are removed in the regions enclosed by the gate lines and the data lines such that the pixel electrode contacts the insulating substrate in the region.

8. The thin film transistor array panel of claim 1, further comprising a plurality of storage electrode overlapping the pixel electrodes.

9. The thin film transistor array panel of claim 8, wherein semiconductor layers of adjacent pixel electrodes are separated by a storage electrode to prevent a parasitic channel in the semiconductor layer.

10. The thin film transistor array of claim 5, wherein a width of the redundant gate pad is wider than a width of the gate pad.

11. The thin film transistor array of claim 10, wherein the semiconductor layer, the gate insulating layer, and the protection layer have the second contact holes.

12. The thin film transistor array of claim 5, wherein a width of the redundant data pad is wider than a width of the data pad.

13. The thin film transistor array of claim 12, wherein the semiconductor layer is formed under the portion of the data pad.

14. The thin film transistor array of claim 5, wherein a width of a lower part of the second contact hole is narrower than the width of the gate pad, and a width of a lower part of the third contact hole is narrower than the width of the data pad.

* * * * *